US009464347B2

United States Patent
Arnd et al.

(10) Patent No.: US 9,464,347 B2
(45) Date of Patent: Oct. 11, 2016

(54) HIGH PERFORMANCE TOOLS EXHIBITING REDUCED CRATER WEAR IN PARTICULAR BY DRY MACHINING OPERATIONS

(71) Applicant: Oerlikon Trading AG, Trubbach, Trubbach (CH)

(72) Inventors: Mirjam Arnd, Bad Ragaz (CH); Markus Lechthaler, Bozen (IT); Sebastian Stein, Gams (CH); Anders Olof Eriksson, Buchs (CH)

(73) Assignee: OERLIKON SURFACE SOLUTIONS AG, PFAFFIKON, Pfaffikon Sz (CH)

( * ) Notice: Subject to any disclaimer, the term of this patent is extended or adjusted under 35 U.S.C. 154(b) by 49 days.

(21) Appl. No.: 14/394,483

(22) PCT Filed: Apr. 15, 2013

(86) PCT No.: PCT/EP2013/001098
§ 371 (c)(1),
(2) Date: Oct. 15, 2014

(87) PCT Pub. No.: WO2013/156131
PCT Pub. Date: Oct. 24, 2013

(65) Prior Publication Data
US 2015/0056431 A1  Feb. 26, 2015

Related U.S. Application Data

(60) Provisional application No. 61/624,487, filed on Apr. 16, 2012.

(51) Int. Cl.
C23C 14/06 (2006.01)
C23C 14/02 (2006.01)
(Continued)

(52) U.S. Cl.
CPC ......... *C23C 14/0641* (2013.01); *C23C 14/021* (2013.01); *C23C 14/024* (2013.01); *C23C 14/0647* (2013.01); *C23C 14/0688* (2013.01); *C23C 14/325* (2013.01);
(Continued)

(58) Field of Classification Search
USPC .......... 51/307, 309; 428/216, 336, 697, 698, 428/699; 204/192, 192.15, 192.16
See application file for complete search history.

(56) References Cited

U.S. PATENT DOCUMENTS 6,077,596 A * 6/2000 Hashimoto ......... C23C 14/0635
428/336
7,763,366 B2 * 7/2010 Yamamoto .............. C23C 14/06
204/192.16

(Continued)

FOREIGN PATENT DOCUMENTS

JP  2004-256922  *  9/2004
JP  2008-030158  *  2/2008

(Continued)

OTHER PUBLICATIONS

International Search Report for PCT/EP2013/001098 dated Sep. 19, 2013.

*Primary Examiner* — Archene Turner
(74) *Attorney, Agent, or Firm* — Pearne & Gordon LLP

(57) ABSTRACT

The present invention relates to a coating system comprising at least one multi-layered film formed of alternated A- and B-nanolayers deposited one on each other characterized in that the A-nanolayers contain essentially aluminum chromium boron nitride and the B-nanolayers contain essentially aluminum chromium nitride.

22 Claims, 1 Drawing Sheet

(51) Int. Cl.
*C23C 14/32* (2006.01)
*C23C 14/34* (2006.01)
*C23C 14/35* (2006.01)
*C23C 14/50* (2006.01)

(52) U.S. Cl.
CPC ........ *C23C 14/345* (2013.01); *C23C 14/3414* (2013.01); *C23C 14/3464* (2013.01); *C23C 14/3485* (2013.01); *C23C 14/3492* (2013.01); *C23C 14/35* (2013.01); *C23C 14/505* (2013.01); *Y10T 428/2495* (2015.01); *Y10T 428/265* (2015.01)

(56) References Cited

U.S. PATENT DOCUMENTS

| | | | | |
|---|---|---|---|---|
| 8,211,554 B2* | 7/2012 | Fontaine | ............... | C08J 7/047 428/697 |
| 8,293,359 B2* | 10/2012 | Kathrein | ............... | B65B 1/26 51/309 |
| 8,491,989 B2* | 7/2013 | Lechthaler | ............... | C23C 14/0036 204/192.1 |
| 8,926,722 B2* | 1/2015 | Lechthaler | ............... | C23C 14/0641 428/216 |
| 8,932,707 B2* | 1/2015 | Sugita | ............... | C23C 14/0688 428/699 |
| 2012/0213990 A1 | 8/2012 | Sugita | | |

FOREIGN PATENT DOCUMENTS

| | | | |
|---|---|---|---|
| JP | 2009-012139 | * | 1/2009 |
| WO | 2008/037556 A2 | | 4/2008 |
| WO | 2010/003902 A1 | | 1/2010 |
| WO | 2011/058636 A1 | | 5/2011 |
| WO | 2011/095292 A1 | | 8/2011 |

* cited by examiner

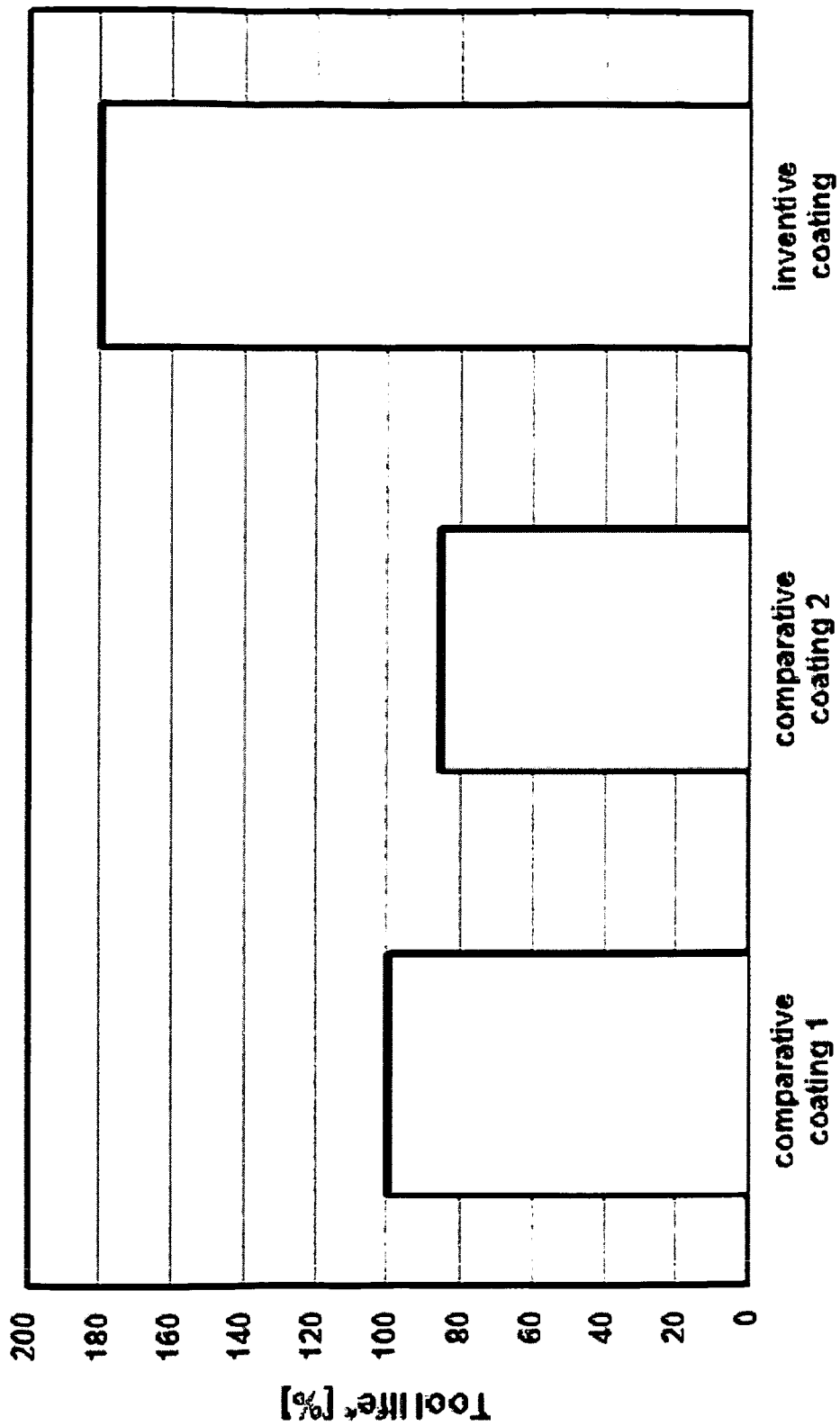

HIGH PERFORMANCE TOOLS EXHIBITING REDUCED CRATER WEAR IN PARTICULAR BY DRY MACHINING OPERATIONS

The present invention relates to a coating system for reducing crater wear of cutting tools by machining operations, particularly beneficial in dry machining operations such as hobbing, and being able to be removed from the cutting tool using uncomplicated decoating processes. Further, the present invention relates to a method for coating surfaces with the coating system according to the invention.

STATE OF THE ART

Cutting tools are subjected to very different wear conditions when they are used by dry or wet machining operations.

For example, crater wear is often observed as a first sign of wear by dry machining operations at high cutting speeds. Particularly by hobbing it has been observed that crater wear limits drastically the cutting tool life time.

AlCrN-based coatings are nowadays well-established coating systems for increasing cutting performance and life time of cutting tools used by dry machining operations.

However, in despite of the current improvements attained by using AlCrN-based coatings according to the state of the art, everyday new increased requirements are created that need to be met.

Another advantage of AlCrN-based coatings consists in its ability to be removed from the cutting tools by means of uncomplicated decoating processes which are easier, cheaper and often less prejudicial for the cutting tool surface than for example those that must be used for removing AlTiN-based coatings.

OBJECTIVE OF THE PRESENT INVENTION

The objective of the present invention is to provide an AlCrN-based coating system that in comparison to the state of the art allows a significant reduction of crater wear and consequently of flank wear and consequently significantly increasing cutting performance and life time of cutting tools used in dry machining operations, particularly by hobbing. Further, the coating system provided according to the present invention should be able to be removed from the cutting tools by means of uncomplicated decoating processes. Furthermore, it is an objective of the present invention to provide a method for the production of the coating system according to the present invention which should be applicable for coating of cutting tools.

DESCRIPTION OF THE INVENTION

The objective of the present invention was achieved by providing a coating system containing a multi-layered film formed of aluminium chromium boron nitride (Al—Cr—B—N) and aluminium chromium nitride (Al—Cr—N) nano-layers, the multi-layered film exhibiting a particular combination of low thermal conductivity coefficient, low abrasive wear coefficient, high hardness and excellent adhesion strength.

A preferred embodiment of a coating system according to the present invention is characterized by exhibiting a thermal conductivity coefficient lower than 3.0 W/m·K, preferably lower than 2.5 W/m·K.

In a preferred embodiment of the coating system according to the present invention, the multi-layered film is formed of Al—Cr—B—N and Al—Cr—N nano-layers which are deposited alternatingly one on each other. The Al—Cr—B—N nano-layers having element composition $(Al_xCr_{1-x-z}B_z)N$ wherein x=50-80 at-% and z=5-30 at-% and x+z≤90 at-%, preferably x=50-70 at-% and z=10-20 at-% and x+z≤80 at-%, where x and z being the concentration of Al and the concentration of B, respectively, in atomic percentage if the total quantity of atoms of Al, Cr and B present in each Al—Cr—B—N nano-layer is considered as 100 atomic percent. The Al—Cr—N nano-layers having element composition $(Al_yCr_{1-y})N$ wherein y=50-80 at-%, preferably 60-70 at-%, and y being the concentration of Al in atomic percentage if the total quantity of atoms of Al and Cr present in each Al—Cr—N nano-layer is considered as 100 atomic percent.

In a further preferred embodiment of the coating system according to the present invention, the ratio of the thickness of the Al—Cr—N nano-layers to the thickness of the Al—Cr—B—N nano-layers ($thickness_{AlCrN}/thickness_{AlCrBN}$) in the multi-layered film is ≤2, preferably about 1.

In a further preferred embodiment of the coating system according to the present invention, the thickness of two on each other deposited Al—Cr—N and Al—Cr—B—N nano-layers ($thickness_{AlCrN}+thickness_{AlCrBN}$) in the multi-layered film is ≤200 nm, preferably ≤100, more preferably ≤50 nm, particularly about 10-30 nm.

One more preferred embodiment of the coating system according to the present invention includes a base layer under the multi-layered film, the base layer having element composition $(Al_wCr_{1-w})N$ wherein w=50-80 at-%, preferably 60-70 at-% and w being the concentration of Al in atomic percentage if the total quantity of atoms of Al and Cr present in the base layer is considered as 100 atomic percent. The ratio of the thickness of the base layer to the thickness of the multi-layered film ($thickness_{base\_layer}/thickness_{multi-layered\_film}$) is preferentially between 2 and 5, more preferentially about 3 and 4.

Coatings systems according to the present invention can be produced particularly well by means of physical vapour deposition (PVD) methods.

Special advantageous for the production of coating systems according to the present invention are the arc ion plating (AIP) deposition methods.

A preferred embodiment of a coating method for production of coating systems according to the present invention is an arc ion plating method in which the material for forming the coating on the substrate surfaces is provided by arc evaporation of Al—Cr and Al—Cr—B targets in a nitrogen atmosphere.

A further preferred embodiment of a coating method for production of coating systems according to the present invention includes a plasma etching step previous to coating deposition which is carried out in a nitrogen, or in a nitrogen/hydrogen, or in a nitrogen/hydrogen/argon atmosphere for creating a diffusion zone in the substrate.

EXPERIMENTAL EXAMPLES

Hobbing tools were coated in an arc ion plating coating machine according to the present invention. The substrates were introduced in the coating chamber, the coating chamber was pumped down to less than 0.4 Pa, the substrates were heated and etched in argon or argon/hydrogen atmosphere respectively, a coating system consisting of a base layer and a multi-layered film according to the present invention were deposited on the substrates. For the coating deposition were used Al—Cr—B and Al—Cr alloyed targets having respectively for example following element compositions in atomic percentage: $Al_{52}Cr_{28}B_{20}$ and $Al_{50}Cr_{50}$ or $Al_{52}Cr_{28}B_{20}$ and $Al_{70}Cr_{30}$ or $Al_{70}Cr_{20}B_{10}$ and $Al_{50}Cr_{50}$ or $Al_{70}Cr_{20}B_{10}$ and $Al_{70}Cr_{30}$. In some cases it was deposited first the Al—Cr—N base layer and afterwards the multi-layered Al—Cr—B—N film, in other cases only the multi-layered Al—Cr—B—N film. For the deposition of the base layers only material from the Al—Cr targets were evaporated. The Al—Cr—B and Al—Cr alloyed targets were placed strategically in the coating machine in order to deposit the respective Al—Cr—B—N and Al—Cr—N nano-layers alternated one on each other by rotational movement of the substrates in the coating chamber. The arc current for the evaporation of the Al—Cr—B—N and Al—Cr—N targets was selected accordingly in order to obtain the most efficient process and the desired thickness relations regarding the different layers and/or respectively nano-layers and at the same time appropriate mechanical properties.

The inventors found that Al—Cr—B—N coatings exhibit lower compressive stress than Al—Cr—N coatings and the Al—Cr—B—N coatings are in some degree porous. Furthermore, by increasing the boron-content in the Al—Cr—B—N coatings a reduction of the compressive stress was observed. However, too low compressive stresses can also be disadvantageous for applications in machining operations. For this reason the inventors applied a bias voltage at substrate in order to increase the compressive stress in the films. Surprisingly the inventors found that by applying substrate bias voltages of at least 70 V, but preferably greater than 70 V, during deposition of the Al—Cr—B—N layers, it is possible to produce particularly interesting Al—Cr—B—N layers having an especially high density (avoiding porosity), a stupendously low thermal conductivity coefficient and a suitable compressive stress at the same time. Consequently the inventors could deposit Al—Cr—B—N layers having most suitable properties for defined applications regarding density, thermal coefficient and compressive stress by adjusting bias voltage and boron content. Thus, it was for example possible to deposit Al—Cr—B—N layers from $Al_{52}Cr_{28}B_{20}$ targets which exhibit a very low thermal conductivity coefficient of about 2.0 W/m·K.

The inventors found also, that by varying the substrate bias voltage from a lower value $U_{Bias\_low}$ up to a higher value $U_{Bias\_high}$ by depositing the Al—Cr—N base layer according to the present invention, especially good coating mechanical properties and adhesion strength can be obtained. The substrate bias voltage can be increased continuously or stepwise.

A further embodiment of a coating method for depositing a coating system according to the present invention involves a deposition of the base layer varying the substrate bias voltage during deposition from a lower bias voltage to the higher bias voltage gradually or stepwise. For example, in at least two steps and preferably wherein $U_{Bias\_lowest} \leq 4 \cdot U_{Bias\_highest}$.

The very impressive improvement in cutting tool life time that can be attained using coating systems according to the present invention will be further shown by presenting the results of an exemplary cutting test.

Exemplary Cutting Test

PM-HSS hob s390 Böhler for synchronous milling having modulus $m_n$=2.557 mm, pressure angle $\alpha_{n0}$=17.5° and diameter $d_{a0}$=110 mm were coated with three different coating systems:

a comparative coating 1: coating system according to the state of the art consisting fundamentally of $(Al_{70}Cr_{30})$N, a comparative coating 2: coating system according to the state of the art consisting of a multi-layered coating containing $(Al_{70}Cr_{30})$N and Al—Cr—Si—W—N layers, and an inventive coating: coating system according to the present invention having a base layer of essentially Al—Cr—N deposited from $Al_{70}Cr_{30}$ targets in an atmosphere comprising essentially nitrogen, and a multi-layered film formed essentially of Al—Cr—N and Al—Cr—B—N nano-layers deposited alternated one on each other, the Al—Cr—N nano-layers deposited from $Al_{70}Cr_{30}$ targets and the Al—Cr—B—N layers deposited from $Al_{70}Cr_{20}B_{10}$ targets in an atmosphere comprising essentially nitrogen, for the deposition of the Al—Cr—B—N layers. For the deposition of the Al—Cr—B—N layers a bias voltage greater than 70 V was applied at substrate.

The cutting tools coated with the comparative coating 1, comparative coating 2 and the inventive coating described above were tested by fly hobbing of 16MnCr5 (hardness: 160 HB) by following cutting conditions:
dry
$V_c$=240 m/min
$f_a$=4.8 mm
$H_{cu,\ max\ according\ to\ SPARTA}$=0.25 mm
Tool life criterion: crater wear depth (KT) or flank wear $VB_{max} \geq 150$ µm As it is shown in FIG. 1, by using coatings according to the present invention it is possible to improve significantly the cutting performance and to attain a formidable increment of the tool life in comparison with established state of the art coatings.

Thermal Conductivity, Abrasive Wear Resistance and Hardness

Within the scope of the present invention thermal conductivity coefficients of different coating layers were measured according to the measuring technique proposed and described by Prof. David G. Cahill in his paper titled "Analysis of heat flow in layered structures for time-domain thermoreflectance" published in Rev. Sci. Instrum. 75, 5119 (2004).

Additionally, abrasive wear coefficients of the same coating layers were determined using an abrasive wear tester of the type kaloMAX NT according to the DIN V ENV 1071. According to this method a ball is driven by a shaft with rubber wheels and slides along the sample. The angle of the sample holder to the horizontal axis and the ball size determine the applied load between the ball and the sample surface. A slurry is fed on the ball centre and is moved into the contact area and the ball grinds a crater into the sample. The amount of the removed material is calculated by measuring the craters diameter and the wear coefficient is calculated from load, sliding distance and volume of the wear crater. Since this measuring technique is extremely dependent on humidity and temperature, the test was carried out in a climate controlled room at a room temperature of 20° C. and humidity of 39% using a ball having a diameter of 30 mm, slurry containing aluminium oxide particles having a grain size of 1 µm, at a sliding velocity of 100 rpm.

In the table 1 are shown the thermal conductivity coefficients, Vickers hardness values and abrasive wear coefficients of the comparative coating 1, the comparative coating 2, the inventive coating, a monolayer Al—Cr—B—N coating and a monolayer Ti—Al—N coating. The monolayer Al—Cr—B—N coating was deposited from Al—Cr—B targets having element composition in atomic percent 52:28:20 in an atmosphere comprising essentially nitrogen and using a bias voltage greater than 70 V. The monolayer Ti—Al—N coating was deposited from Ti—Al targets having element composition in atomic percent 50:50 in an atmosphere comprising essentially nitrogen.

As it can be observed in table 1, the inventive coating exhibits a very good combination of film properties, which are surprisingly very similar to the film properties of the monolayer Al—Cr—B—N coating in despite of the different coating constitution.

Coatings deposited according to the present invention, which comprise a multi-layered Al—Cr—N/Al—Cr—B—N film and/or which comprise a multi-layered Cr—Al—N/Cr—Al—B—N film and a base Cr—Al—N layer exhibit nevertheless better cutting performance than monolayer Al—Cr—B—N coatings.

TABLE 1

Measured thermal conductivity coefficients, Vickers hardness values and abrasive wear coefficients

| | Thermal conductivity coefficient λ at T = 50-200° C. [W/m · K] | Hardness HV | Abrasive wear coefficient $m^3/(mN)$ |
|---|---|---|---|
| comparative coating 1 | $2.5 < \lambda_{50\text{-}200° C.} < 3.2$ | 2600-3100 | $1 \cdot 10^{-15}$-$3 \cdot 10^{-15}$ |
| comparative coating 2 | $2.5 < \lambda_{50\text{-}200° C.} < 3$ | 2800-3200 | $2 \cdot 10^{-15}$-$3.5 \cdot 10^{-15}$ |
| inventive coating | $\lambda_{50\text{-}200° C.} < 2.5$ | ≥3300 | $1 \cdot 10^{-16}$-$9 \cdot 10^{-16}$ |
| Al—Cr—B—N coating deposited from $Al_{52}Cr_{28}B_{20}$ targets | $\lambda_{50\text{-}200° C.} \cong 2$ | ≅3400 | ≅$3 \cdot 10^{-16}$ |
| Ti—Al—N coating deposited from $Ti_{50}Al_{50}$ targets | $\lambda_{50\text{-}200° C.} > 6.5$ | 2500-3000 | $4 \cdot 10^{-15}$-$8 \cdot 10^{-15}$ |

In the context of the present invention the thickness of each individual nanolayer A and B is preferably not greater than 200 nm, more preferably not greater than 100 nm.

The highest boron concentration in the (AlxCr1-x-zBz)N layers according to the present invention could be also lower than 5 at % but preferably not lower than 2 at. % in order to produce boron containing layers having a low thermal conductivity coefficient as possible. A coating having a low thermal conductivity coefficient according to the present invention is very advantageously for diminishing thermal load in cutting tools exposed to high temperatures which are results during cutting processes at high cutting speeds (Vc>200 m/min). This attribute of the coatings produced according to the present invention is particularly beneficial for diminishing crater wear in cutting tools made of high speed steel such as HSS-hobs, because crater wear is produced in these kinds of cutting tools basically because of too high thermal loads.

In the context of the present invention the aluminium chromium boron nitride (Al—Cr—B—N) nano-layers will be referred to as A-nanolayers and the aluminium chromium nitride (Al—Cr—N) nano-layers will be referred to as B-nanolayers. The A- and B-nanolayers contain essentially aluminium, chromium, boron and nitrogen or aluminium chromium and nitrogen, respectively. However, the A- and B-nanolayers may comprise small amounts of other elements but the small amounts of other elements in these A- and B layers should not be higher than 5% of the total concentration in atomic percentage of the sum of aluminium, chromium and boron in the A-layers and/or of the total concentration in atomic percentage of the sum of aluminium and chromium in the B-layers.

If the A- and B-nanolayers forming the multi-layered film are produced by means of a PVD-reactive process carried out in such a manner that the substrate surfaces to be coated are rotated in the coating chamber in such a manner that the surfaces are alternately exposed to the AlCrB-containing targets and to the AlCr-containing targets in order to produce the A- and B-nanolayers, respectively, it is understood that:

between the A- and B-nanolayers having essentially an element concentration corresponding to the formulas $(Al_xCr_{1-x-z}B_z)N$ and $(Al_yCr_{1-y})N$, as it was described before, there could be areas which contain aluminium chromium boron and nitrogen but which have a lower boron concentration, most probably the boron concentration in these areas is graded. In this areas the boron concentration can be lower than 3 at.-%. But in this cases the condition z≥3%, preferably z≥5% in the formula $(Al_xCr_{1-x-z}B_z)N$ is referred to the areas of the A-nanolayers having the highest boron content.

In a further preferred embodiment of a coating system according to the present invention the ratio of the aluminium content to the chromium content in atomic percentage is maintained constant along the thickness of the multi-layered film formed of alternated A- and B-nanolayers containing essentially aluminium chromium boron nitride and aluminium chromium nitride, respectively. If the coating system according to the present embodiment of the present invention comprises also a base layer containing also aluminium and chromium, the base layer is produced in order to have the same ratio of aluminium content to chromium content like in the multi-layered film.

For some cutting operations a very good cutting performance can be also attained by using cutting tools coated with a coating system according to the present invention having a ratio of the thickness of the base layer to the thickness of the multi-layered film ($thickness_{base\_layer}/thickness_{multi\text{-}layered\_film}$) of about 0.25 or higher, preferably of about 0.5 or higher.

A further preferred embodiment of a coating system according to the present invention comprises more than one multi-layered film made of A- and B-nanolayers along the total thickness of the coating system.

In one preferred variant of this preferred embodiment comprising more than one multi-layered film, the coating system is deposited on a surface of a cutting tool, the coating system comprising a base layer made of aluminium chromium nitride which is deposited on substrate surface and a multilayer-structured film deposited on the base layer, wherein the multilayer-structured film is formed by C- and D-layers deposited alternate one on each other, wherein the C-layers are AlCrN-layers which don't contain boron, and D-layers are multi-layered films made of alternated A- and B-nanolayers.

In one more preferred variant of this preferred embodiment the surface of the cutting tool on which the coating system is deposited is a nitrogen-enriched zone.

The creation of a nitrogen-enriched zone in the tool substrate surface to be coated according to the present invention contributes significantly for reducing tools crater wear.

A preferred method for producing coating systems according to the present invention is a PVD-method at which the elements aluminium, chromium and boron for the production of the A- and B-nanolayers come from targets having an element composition in atomic percentage $(Al_iCr_{1-i})_{1-j}B_j$ and $(Al_iCr_{1-i})$, respectively, and where:
  i is preferably not lower than 50 at.-% and not greater than 80 at, more preferably i is 70 at.-%.
  j is preferably not lower than 2 at.-% and not greater than 30 at.-%

For coating substrates with a coating system according to the present invention are also magnetron sputtering processes, particularly including high power impulse magnetron sputtering (HIPIMS) techniques suitable.

Furthermore, targets made by powder metallurgy are particularly suitable for the production of coating systems according to the present invention.

Particularly, the most preferred embodiments of coating systems, coated substrates and methods for coating substrates with coating systems according to the present invention are described in the following claims 1 to 15.

What is claimed is:

1. Coating system deposited on a surface of a substrate comprising at least one multi-layered film formed of alternated A- and B-nanolayers deposited one on each other, wherein the A-nanolayers consist of aluminium chromium boron nitride and the B-nanolayers contain aluminium chromium nitride but not contain boron
  characterized in that the A-nanolayers have a region with highest boron content and a region with lower boron content, wherein the region having lower boron content is the region which is adjacent to the B-nanolayers.

2. Coating system according to claim 1 characterized in that the coating system exhibits a thermal conductivity coefficient lower than 3.0 W/m·K.

3. Coating system according to claim 1 characterized in that the sum of the thickness of an A-nanolayer and the thickness of a B-nanolayer deposited one on each other in the multi-layered film is not greater than 200 nm.

4. Coating system according to claim 1 characterized in that the ratio of the thickness of a B-nanolayer to the thickness of an A-nanolayer deposited one on each other in the multi-layered film is not greater than 2.

5. Coating system according to claim 4, wherein the ratio of the thickness of a B-nanolayer to the thickness of an A-nanolayer deposited one on each other in the multi-layered film is about 1.

6. Coating system according to claim 1 characterized in that the coating system comprises a base layer deposited between the substrate surface and the multi-layered film, preferably the element composition of the base layer is essentially defined by the formula $(Al_wCr_{1-w})N$ wherein:
  w is the concentration of Al in atomic percent if only the elements Al and Cr are considered for the calculation, with
  w=50-80 at %.

7. Coating system according to claim 6 characterized in that the coating system comprises a multilayer-structured film deposited on the base layer, wherein the multilayer-structured film is formed by C- and D-layers deposited alternate one on each other, wherein the C-layers are AlCrN-layers don't containing boron, and the D-layers are multi-layered films formed of alternated A- and B-nanolayers.

8. Coating system according to claim 1 characterized by having a constant ratio of aluminium content to chromium content at least along the thickness of the multi-layered film or at least if given along the thickness of the base layer.

9. Coated substrate with a coating system according to claim 1 characterized in that the substrate comprises a nitrogen-enriched diffusion zone at the interface with the coating system.

10. Coating system deposited on a surface of a substrate comprising at least one multi-layered film formed of alternated A- and B-nanolayers deposited one on each other, wherein the A-nanolayers consist of aluminium chromium boron nitride and the B-nanolayers contain aluminium chromium nitride but not contain boron characterized in that
  the element composition of the A-nanolayers or if given in the region of the A-nanolayers having highest boron content is essentially defined by the formula $(Al_xCr_{1-x-z}B_z)N$ wherein:
    x and z are respectively the concentration of Al and the concentration of B in atomic percent if only the elements Al, Cr and B are considered for the calculation, with
    x=50-80 at-% and z=3-30 at-% and x+z≤90 at-%, and/or
  the element composition of the B-nanolayers is essentially defined by the formula $(Al_yCr_{1-y})N$ wherein:
    y is the concentration of Al in atomic percent if only the elements Al and Cr are considered for the calculation, with
    y=50-80 at-%.

11. Coating system according to claim 10 wherein x=50-70 at-% and z=10-20 at-% and x+z≤80 at-% and y=60-70 at-%.

12. Coating system deposited on a surface of a substrate comprising at least one multi-layered film formed of alternated A- and B-nanolayers deposited one on each other, wherein the A-nanolayers consist of aluminium chromium boron nitride and the B-nanolayers contain aluminium chromium nitride but not contain boron, wherein the coating system comprises a base layer deposited between the substrate surface and the multi-layered film characterized in that the coating system comprises a multilayer-structured film deposited on the base layer, wherein the multilayer-structured film is formed by C- and D-layers deposited alternate one on each other, wherein the C-layers are AlCrN-layers don't containing boron, and the D-layers are multi-layered films formed of alternated A- and B-nanolayers.

13. Method for coating a surface of a substrate with a coating system according to claim 1 characterized in that at least the multi-layered film is deposited by means of physical vapour deposition techniques of at least one target containing aluminium chromium and boron for forming the A-nanolayers and at least one target containing aluminium and chromium for producing the B-nanolayers in a nitrogen containing atmosphere, and at least by depositing the B-containing layers a negative bias voltage at the substrate is applied.

14. Method according to claim 13 characterized in that the target for forming the A-nanolayers has an element composition in atomic percentage given by the formula $(Al_iCr_{1-i})_{1-j}B_j$ and the at least one target for forming the B-nanolayers has an element composition in atomic percentage given by the formula $(Al_iCr_{1-i})$, where:
  i is preferably not lower than 50 at.-% and not greater than 80 at.-%,
  j is preferably not lower than 2 at.-% and not greater than 30 at.-%.

15. Method according to claim 14, wherein i is 70 at.-%.

16. Method according to claim 13 for coating a surface of a substrate with a coating system comprising at least one multi-layered film formed of alternated A- and B-nanolayers deposited one on each other, wherein the A-nanolayers consist of aluminium chromium boron nitride and the B-nanolayers contain aluminium chromium nitride but not contain boron, wherein the A-nanolayers have a region with highest boron content and a region with lower boron content, wherein the region having lower boron content is the region which is adjacent to the B-nanolayers, and wherein a base layer deposited between the substrate surface and the multi-layered film characterized in that the base layer is deposited by means of a physical vapour deposition technique.

17. Method according to claim 16, wherein an element composition of the base layer is essentially defined by the formula $(Al_wCr_{1-w})N$ wherein:

w is the concentration of Al in atomic percent if only the elements Al and Cr are considered for the calculation, with w=50-80 at-%.

18. Method according to claim 16, wherein the physical vapour deposition technique comprises a reactive cathodic arc ion plating techniques and applying a negative bias voltage at the substrate during at least a part of the deposition time.

19. Method according to claim 16 characterized in that a negative bias voltage applied during the deposition of the base layer is varied during deposition and increased from a lowest value $U_{Bias\_lowest}$ up to a highest value $U_{Bias\_highest}$.

20. Method according to claim 19 wherein the lowest value $U_{Bias\_lowest}$ is not greater than 4 times the highest $U_{Bias\_highest}$ in absolute value.

21. Method according to claim 13 for producing a coated substrate comprising at least one multi-layered film formed of alternated A- and B-nanolayers deposited one on each other, wherein the A-nanolayers consist of aluminium chromium boron nitride and the B-nanolayers contain aluminium chromium nitride but not contain boron, wherein the A-nanolayers have a region with highest boron content and a region with lower boron content, wherein the region having lower boron content is the region which is adjacent to the B-nanolayers and wherein the substrate comprises a nitrogen-enriched diffusion zone at the interface with the coating system, characterized in that the diffusion zone is produced by accomplishing a plasma etching step prior to coating deposition which is carried out in a nitrogen, or in a nitrogen/hydrogen, or in a nitrogen/hydrogen/argon atmosphere.

22. Method according to claim 13 wherein the physical vapour deposition techniques comprise cathodic arc and/or magnetron sputtering techniques, in particular high power impulse magnetron sputtering techniques, material for forming the multi-layered film is provided by cathodic arc ion plating evaporation, wherein the target for forming the A-nanolayers comprises a powder metallurgy made target, and the target for forming the B-nanolayers comprises a powder metallurgy made target, and wherein the negative bias voltage is not lower than 70 V in absolute value.

* * * * *

UNITED STATES PATENT AND TRADEMARK OFFICE
CERTIFICATE OF CORRECTION

PATENT NO. : 9,464,347 B2
APPLICATION NO. : 14/394483
DATED : October 11, 2016
INVENTOR(S) : Mirjam Arndt et al.

Page 1 of 1

It is certified that error appears in the above-identified patent and that said Letters Patent is hereby corrected as shown below:

On the Title Page

Item (72) Inventors, replace "Mirjam Arnd" with -- Mirjam Arndt --.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*